(12) United States Patent
Kim et al.

(10) Patent No.: US 8,563,412 B2
(45) Date of Patent: Oct. 22, 2013

(54) METHOD OF FABRICATING SEMICONDUCTOR DEVICE

(75) Inventors: Kyu-Tae Kim, Yongin-si (KR); Jong-Seo Hong, Yongin-si (KP)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 13/204,874

(22) Filed: Aug. 8, 2011

(65) Prior Publication Data

US 2012/0052667 A1 Mar. 1, 2012

(30) Foreign Application Priority Data

Aug. 25, 2010 (KR) .................. 10-2010-0082556

(51) Int. Cl.
*H01L 21/3205* (2006.01)

(52) U.S. Cl.
USPC ..................... 438/585; 438/586; 257/382

(58) Field of Classification Search
CPC ............ H01L 21/027; H01L 21/76898; H01L 21/76808; H01L 21/76897; H01L 21/76877; H01L 21/76889; H01L 21/3475; H01L 21/823871; H01L 21/823814
USPC ................. 438/585, 586, 587, 595, 597, 233; 257/382, E23.142, E21.577, E21.409
See application file for complete search history.

(56) References Cited

U.S. PATENT DOCUMENTS

| | | | |
|---|---|---|---|
| 6,653,739 B2 | 11/2003 | Terauchi | |
| 2006/0261041 A1* | 11/2006 | Kwon et al. | ...................... 216/89 |
| 2009/0163032 A1* | 6/2009 | Hyun | .............................. 438/706 |
| 2011/0156107 A1* | 6/2011 | Bohr et al. | ..................... 257/288 |

FOREIGN PATENT DOCUMENTS

| | | |
|---|---|---|
| JP | 2008-211027 | 9/2008 |
| KR | 2001-0109369 | 12/2001 |

* cited by examiner

*Primary Examiner* — Khiem D Nguyen
(74) *Attorney, Agent, or Firm* — Onello & Mello, LLP

(57) ABSTRACT

A method of fabricating a semiconductor device includes forming gate patterns on a substrate, forming spacers on sidewalls of the gate patterns, forming a first capping insulation layer pattern on the gate patterns and the spacers, forming a second capping insulation layer pattern on the first capping insulation layer pattern, forming a passivation layer pattern filling contact holes between the gate patterns, removing the second capping insulation layer pattern while protecting the spacers using the passivation layer pattern, removing the passivation layer pattern to expose a top surface of the substrate, forming a silicide forming metal film on the surface of the substrate, and forming silicide patterns on the exposed top surface of the substrate.

20 Claims, 9 Drawing Sheets

METHOD OF FABRICATING SEMICONDUCTOR DEVICE

CROSS-REFERENCE TO RELATED APPLICATION

This application claims priority from Korean Patent Application No. 10-2010-0082556 filed on Aug. 25, 2010 in the Korean Intellectual Property Office, and all the benefits accruing therefrom under 35 U.S.C. 119, the contents of which in their entirety are herein incorporated by reference.

BACKGROUND

1. Field of the Invention

The present inventive concept relates to a method of fabricating a semiconductor device.

2. Description of the Related Art

Semiconductor devices are typically characterized by small size, high device integration density, multi-function operation, high speed, low manufacturing cost, low power consumption, and other important and desirable characteristics. Semiconductor devices can be identified as storage devices, such as semiconductor memory devices, which store data, and logic devices, which perform various logical operations on data.

With the trend toward small-sized logic devices, highly integrated logic device are increasingly in demand. However, high integration of logic devices may involve several drawbacks and difficulties, the solutions to which are continuously being researched.

SUMMARY

The present inventive concept provides a method of fabricating a semiconductor device, which can facilitate formation of a silicide forming metal film.

According to an aspect of the present inventive concept, there is provided a method of fabricating a semiconductor device, the method including forming gate patterns on a substrate, forming spacers on sidewalls of the gate patterns, forming a first capping insulation layer pattern on the gate patterns and the spacers, forming a second capping insulation layer pattern on the first capping insulation layer pattern, forming a passivation layer pattern filling contact holes between the gate patterns, removing the second capping insulation layer pattern while protecting the spacers using the passivation layer pattern, removing the passivation layer pattern to expose a top surface of the substrate, forming a silicide forming metal film on the surface of the substrate, and forming silicide patterns on the exposed top surface of the substrate.

In some embodiments, the silicide forming metal film is formed by making a direct contact with the first capping insulation layer pattern.

In some embodiments, top surfaces of the passivation layer pattern are lower than top surfaces of the second capping insulation layer pattern and higher than top surfaces of the spacers.

In some embodiments, the forming of the passivation layer pattern comprises: forming a passivation layer on the surface of the substrate having the second capping insulation layer pattern; and etching the passivation layer using an etch-back process.

In some embodiments, the passivation layer pattern comprises an organic material.

In some embodiments, the passivation layer pattern comprises a spin-on hard mask (SOH) layer, an anti-reflection coating (ARC) layer, or photoresist.

In some embodiments, the first capping insulation layer pattern comprises a silicon oxide layer, and the second capping insulation layer pattern and the spacers comprise a silicon nitride layer.

In some embodiments, removing the second capping insulation layer pattern comprises removing the second capping insulation layer pattern using an etching solution containing phosphoric acid.

In some embodiments, forming the gate patterns and the spacers further comprises: forming dummy gate patterns on the substrate; forming the spacers on sidewalls of the dummy gate patterns; forming gate forming trenches by removing the dummy gate patterns, wherein the gate patterns are formed within the gate forming trenches.

In some embodiments, the method further comprises, before forming the gate patterns, forming gate insulation layer patterns within the gate forming trenches.

In some embodiments, the method further comprises, after forming the spacers on the sidewalls of the dummy gate patterns, sequentially forming an etch stop layer and an interlayer dielectric layer on the surface of the substrate having the dummy gate patterns and the spacers, and planarizing the etch stop layer and the interlayer dielectric layer until top surfaces of the dummy gate patters are exposed.

In some embodiments, the first capping insulation layer patterns make a direct contact with top surfaces of the gate patterns and top surfaces of the spacers.

In some embodiments, the method further comprises forming a contact plug filling the contact hole on the silicide pattern.

In some embodiments, the method further comprises forming an etch stop pattern on the sidewalls of the spacers.

In some embodiments, the method further comprises, before the forming of the passivation layer pattern, forming an auxiliary insulation layer on the entire surface of the substrate having the second capping insulation layer pattern; and blanket etching the auxiliary insulation layer to expose the top surface of the substrate.

According to another aspect of the present inventive concept, there is provided a method of fabricating a semiconductor device including forming gate patterns on a substrate, forming spacers on sidewalls of the gate patterns, forming an interlayer dielectric layer filling a contact hole between the gate patterns, forming a first capping insulation layer on the surface of the substrate having the gate patterns and the interlayer dielectric layer, forming a second capping insulation layer on the first capping insulation layer and a mask pattern on the second capping insulation layer pattern, forming a first capping insulation layer pattern by etching the first capping insulation layer using the mask pattern as an etch mask, removing the interlayer dielectric layer by etching the interlayer dielectric layer using the mask pattern as an etch mask, removing the second capping insulation layer pattern, forming a silicide forming metal film on the surface of the substrate, and forming silicide patterns in the contact hole by performing thermal treatment.

In some embodiments, the method further comprises, before removing the second capping insulation layer pattern, forming a passivation layer pattern within the contact hole from which the interlayer dielectric layer is removed.

In some embodiments, the second capping insulation layer and the spacers are formed from a silicon nitride layer.

In some embodiments, the passivation layer pattern is made of an organic material.

In some embodiments, the method further comprises forming a third capping insulation layer pattern on a region of the first capping insulation layer exposed by the second capping insulation layer pattern.

According to another aspect of the inventive concept, there is provided a method of fabricating a semiconductor device, the method comprising: forming dummy gate patterns on a substrate; forming spacers on sidewalls of the dummy gate patterns; removing the dummy gate patterns to form a plurality of trenches; forming gate insulation layer patterns within the trenches; forming a plurality of gate patterns in the plurality of trenches, respectively, such that the spacers are on sidewalls of the gate patterns; forming a first capping insulation layer pattern on the gate patterns and the spacers; forming second capping insulation layer pattern on the first capping insulation layer pattern; forming a passivation layer pattern filling contact holes between the gate patterns and covering the spacers to protect the spacers; removing the second capping insulation layer pattern while protecting the spacers with the passivation layer pattern such that the spacers are not removed; removing the passivation layer pattern to expose a top surface of the substrate; forming a silicide forming metal film on the surface of the substrate; and forming silicide patterns on the exposed top surface of the substrate.

In some embodiments, the semiconductor device is a semiconductor memory device.

In some embodiments, the semiconductor device is a semiconductor logic device.

In some embodiments, the method further comprises forming an etch stop pattern on the sidewalls of the spacers.

In some embodiments, the method further comprises forming a third capping insulation layer pattern on a region of the first capping insulation layer exposed by the second capping insulation layer pattern.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions may be exaggerated for clarity.

DETAILED DESCRIPTION OF THE EMBODIMENTS

Figure 1:
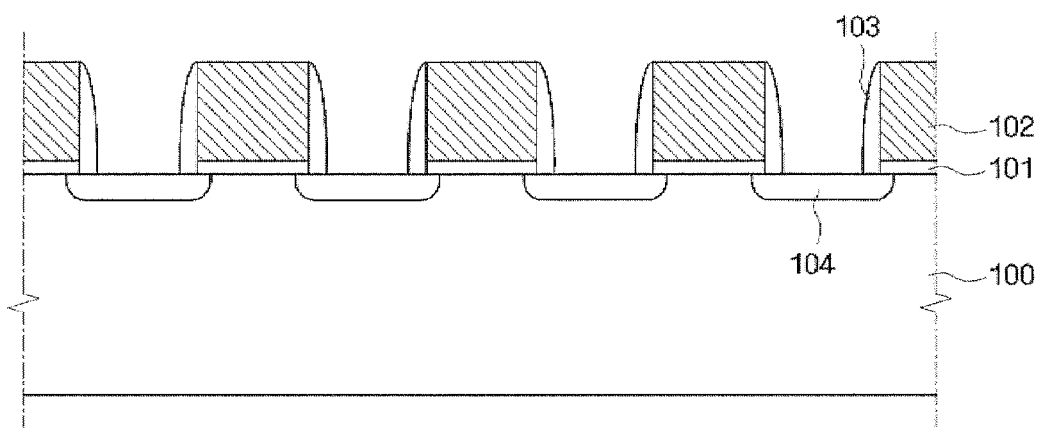
FIGS. 1 to 16 are schematic cross-sectional views illustrating a method of fabricating a semiconductor device according to an exemplary embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments described herein. Rather, these embodiments are provided so that this description will be thorough and complete and will fully convey the inventive concept to those skilled in the art, and the present inventive concept will only be defined by the appended claims.

As used herein, the term "and/or" includes any and all combinations of one or more of the associated listed items.

The terminology used herein is for the purpose of describing particular embodiments only and is not intended to be limiting of the inventive concept. As used herein, the singular forms "a", "an" and "the" are intended to include the plural forms as well as the singular forms, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another element. Thus, for example, a first element, a first component or a first section described below could be termed a second element, a second component or a second section without departing from the teachings of the present inventive concept.

Embodiments described herein will be described referring to plan views and/or cross-sectional views by way of ideal schematic views of the inventive concept. Accordingly, the exemplary views may be modified depending on manufacturing technologies and/or tolerances. Therefore, the embodiments of the inventive concept are not limited to those shown in the views, but include modifications in configuration formed on the basis of manufacturing processes. Therefore, regions exemplified in the figures have schematic properties and shapes of regions shown in figures exemplify specific shapes of regions of elements and do not limit aspects of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present description, and will not be interpreted in an idealized or overly formal sense unless expressly so defined herein.

Hereinafter, a method of fabricating a semiconductor device according to exemplary embodiments of the present inventive concept will be described with reference to FIGS. 1 to 16. FIGS. 1 to 16 are schematic cross-sectional views sequentially illustrating a method of fabricating a semiconductor device according to exemplary embodiments of the present inventive concept.

Referring to FIG. 1, according to some exemplary embodiments, dummy gate insulation layer patterns 101 and dummy gate patterns 102 are formed on a substrate 100. In some exemplary embodiments, the substrate 100 may be a rigid substrate such as a silicon substrate, a silicon on insulator (SOI) substrate, a gallium arsenic substrate, a silicon germanium substrate, a ceramic substrate, a quartz substrate, or a glass substrate for display, or a flexible plastic substrate made of polyimide, polyethylene terephthalate (PET), polyethylene naphthalate (PEN), polymethyl methacrylate (PMMA), polycarbonate (PC), polyester sulfone (PES), or polyester.

In some exemplary embodiments, the dummy gate insulation layer patterns 101 and the dummy gate patterns 102 may be formed by sequentially forming a dummy gate insulation layer and a dummy gate layer on the substrate 100, then forming a photoresist pattern on the dummy gate layer, and then etching the dummy gate insulation layer and the dummy gate layer using the photoresist pattern as an etch mask. In some exemplary embodiments, the dummy gate insulation layer may be formed by thermal oxidation or chemical vapor deposition (CVD). In some exemplary embodiments, the dummy gate insulation layer patterns 101 may be formed from, for example, a silicon oxide layer, and the dummy gate patterns 102 may be made of, for example, polysilicon.

Spacers 103 are formed on sidewalls of the dummy gate insulation layer patterns 101 and the dummy gate patterns 102. In some exemplary embodiments, the spacers 103 may be formed by forming an insulation layer for forming spacers on the substrate 100 having the dummy gate insulation layer patterns 101 and the dummy gate patterns 102, and then anisotropically etching the insulation layer for forming spacers. In some exemplary embodiments, the spacers 103 may be formed from, for example, a silicon nitride layer.

After forming the dummy gate patterns 102, source/drain regions 104 may be formed. In some exemplary embodiments, the source/drain regions 104 may include a lightly doped source/drain region and a heavily doped source/drain region. According to an embodiment of the present inventive concept, after forming the source/drain regions 104, a gate pattern may be formed, as described below in detail. The gate pattern is formed after the source/drain regions 104 because a temperature in a diffusion process used in forming the source/drain regions 104 is higher than a melting point of a metal material used for the gate pattern.

Figure 2:
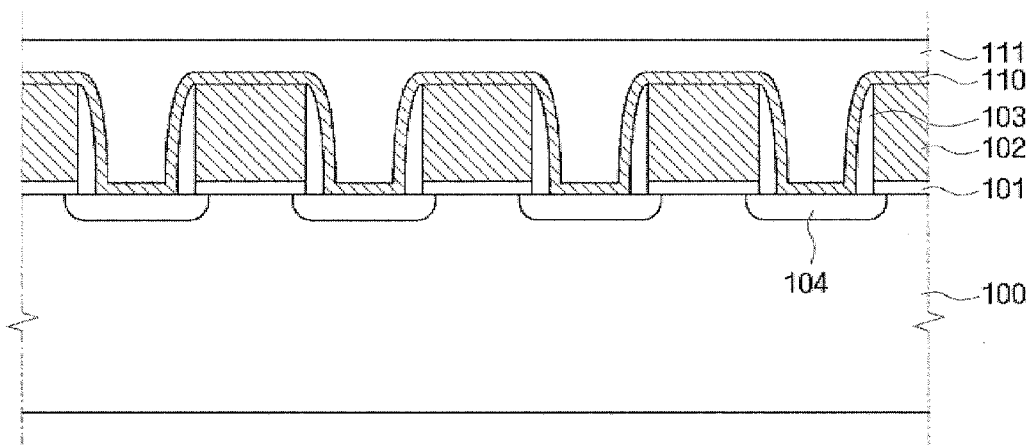

Referring to FIG. 2, in some exemplary embodiments, an etch stop layer 110 is formed on the entire surface of the structure and the substrate 100. The etch stop layer 110 may be made of a material having high etch selectivity with respect to the dummy gate patterns 102. Specifically, the etch stop layer 110 may be, for example, a silicon nitride layer. Next, an interlayer dielectric layer 111 is formed on the etch stop layer 110. In some exemplary embodiments, the interlayer dielectric layer 111 may be formed of, for example, a silicon oxide layer. The etch stop layer 110 and the interlayer dielectric layer 111 may be formed by, for example, chemical vapor deposition (CVD) or plasma enhanced chemical vapor deposition (PECVD).

Figure 3:
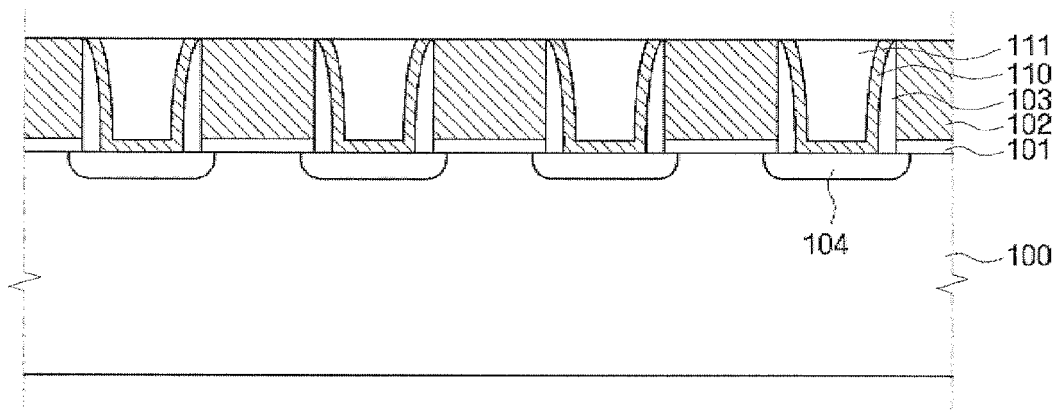

Referring to FIG. 3, a planarizing process may then be performed on the interlayer dielectric layer 111 and the etch stop layer 110 until top surfaces of the dummy gate patterns 102 are exposed. In some exemplary embodiments, the planarizing process may include, for example, chemical mechanical polishing (CMP), etch back, or other similar process.

Figure 4:
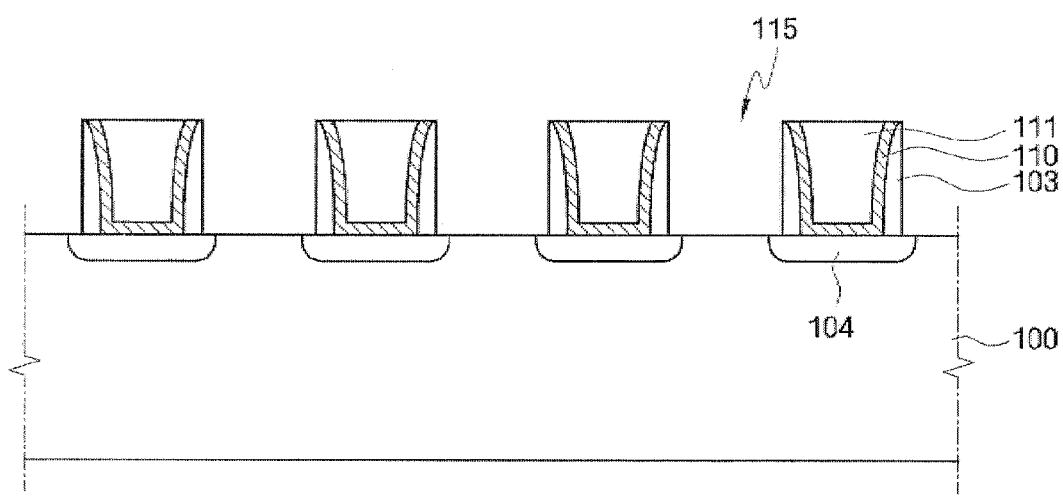

Referring to FIG. 4, in some exemplary embodiments, the dummy gate patterns 102 and the dummy gate insulation layer patterns 101 are removed to form trenches 115 in which gates will be formed. The top surface of a predetermined region of the substrate 100 may be exposed by removing the dummy gate patterns 102 and the dummy gate insulation layer patterns 101. As an alternative to the configuration illustrated in FIG. 4, in some exemplary embodiments, the dummy gate insulation layer patterns 101 may not be removed.

Figure 5:
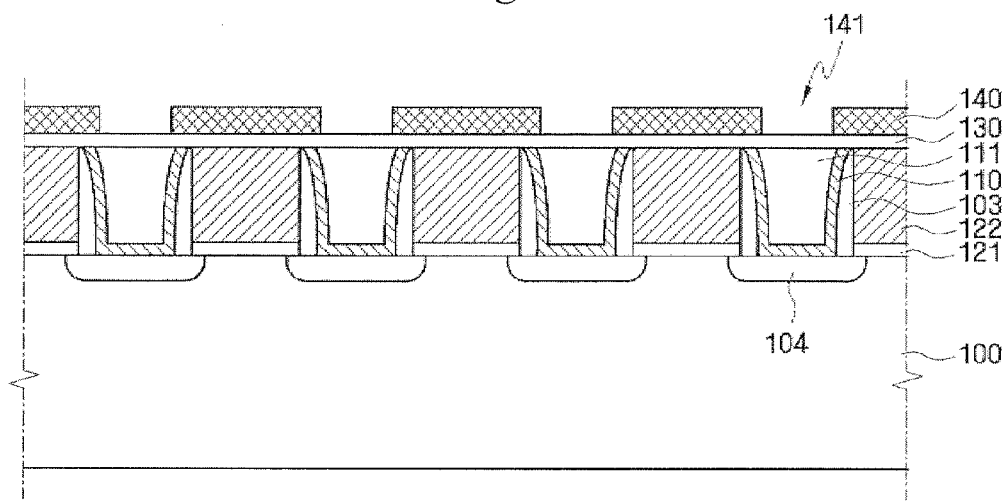

Referring to FIG. 5, gate insulation layer patterns 121 and gate patterns 122 are formed within the gate forming trenches 115. In some exemplary embodiments, the gate patterns 122 may be formed by filling the insides of the gate forming trenches 115 with a metal or a metal compound and performing a planarizing process. In some exemplary embodiments, the metal used to form the gate patterns 122 may include, for example, aluminum, and the metal compound used to form the gate patterns 122 may include, for example, at least one of titanium nitride and tantalum nitride.

In some exemplary embodiments, a first capping insulation layer 130 covering the gate patterns 122 and the interlayer dielectric layer 111 is formed. In some exemplary embodiments, the first capping insulation layer 130 may be formed by making a direct contact with the top surfaces of the gate patterns 122. The first capping insulation layer 130 may be formed of, for example, a silicon oxide layer.

Next, in some exemplary embodiments, a second capping insulation layer is formed on the first capping insulation layer 130. The second capping insulation layer is patterned to form second capping insulation layer patterns 140. In some exemplary embodiments, the second capping insulation layer patterns 140 may be formed of, for example, a silicon nitride layer. In some exemplary embodiments, the second capping insulation layer patterns 140 are formed to overlap the gate patterns 122 and to have first openings 141 exposing regions between the gate patterns 122. In some exemplary embodiments, widths of the second capping insulation layer patterns 140 may be greater than those of the gate patterns 122, as illustrated in FIG. 5.

Figure 6:
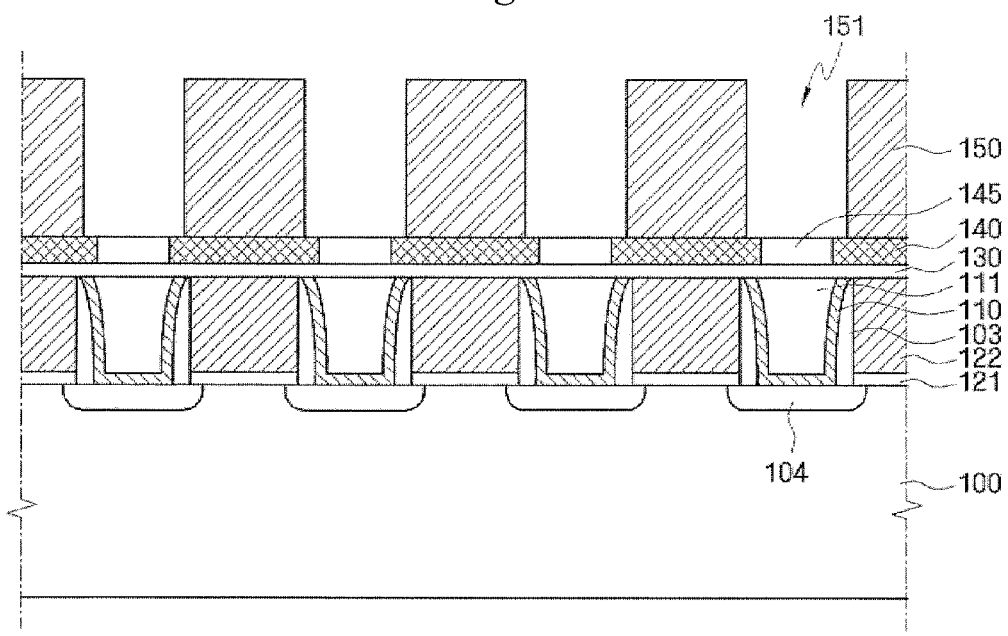

Referring to FIG. 6, in some exemplary embodiments, third capping insulation layer patterns 145 are formed to fill the first openings 141. In some exemplary embodiments, the third capping insulation layer patterns 145 may be formed of, for example, a silicon oxide layer. As an alternative to the configuration illustrated in FIG. 6, the third capping insulation layer patterns 145 may be formed on the second capping insulation layer patterns 140 while filling the first openings 141. Next, in some exemplary embodiments, mask patterns 150 are formed on the second capping insulation layer patterns 140. In some exemplary embodiments, widths of the mask patterns 150 may be smaller than those of the second capping insulation layer patterns 140, as illustrated in FIG. 6. Second openings 151 are formed between the mask patterns 150. In some exemplary embodiments, the mask patterns 150 may be formed of, for example, silicon carbonate (SiC).

Figure 7:
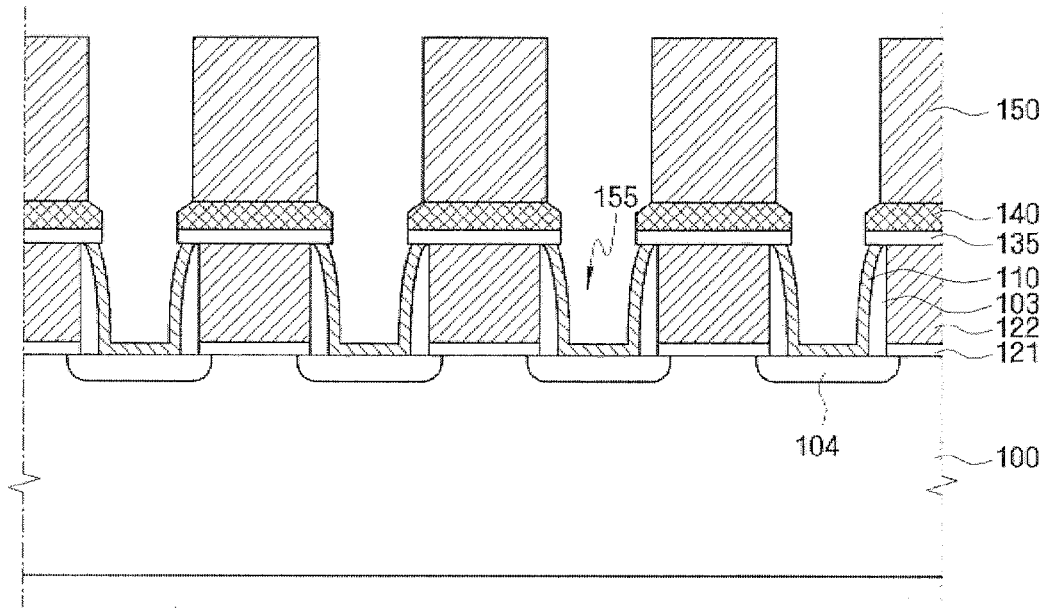

Referring to FIG. 7, in some exemplary embodiments, the third capping insulation layer patterns 145, the first capping insulation layer 130, and the interlayer dielectric layer 111 are etched using the mask patterns 150 as etch masks. As a result of the etching, the third capping insulation layer patterns 145 and the interlayer dielectric layer 111 may be removed, and the first capping insulation layer 130 may be partially removed, leaving first capping insulation layer patterns 135 remaining. In some exemplary embodiments, widths of first capping insulation layer patterns 135 may be greater than those of the gate patterns 122, as illustrated in FIG. 7. The etch stop layer 110 may prevent the substrate 100 from being etched when the third capping insulation layer patterns 145, the first capping insulation layer 130, and the interlayer dielectric layer 111 are etched. In addition, as shown in FIG. 7, the second capping insulation layer patterns 140 may be partially etched when the first capping insulation layer patterns 135 are formed, as schematically illustrated by the beveled corners of the second capping insulation layer patterns 140.

According to the embodiments of the inventive concept, the process of forming the first capping insulation layer patterns 135 may be regarded as a process of forming self-aligned contact holes 155. The self-aligned contact holes 155 may be formed using second capping insulation layer patterns 140 having the first openings 141 and the mask patterns 150 having the second openings 151.

Figure 8:
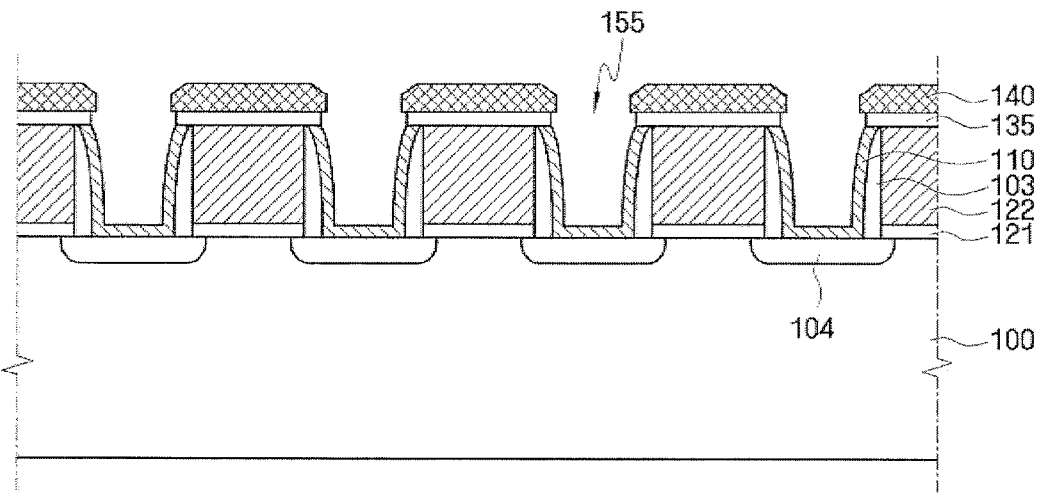

Referring to FIG. 8, in some exemplary embodiments, next, the mask patterns 150 are removed. When the mask patterns 150 are removed, the first capping insulation layer patterns 135 may also be partially etched, as illustrated in FIG. 8.

Figure 9:
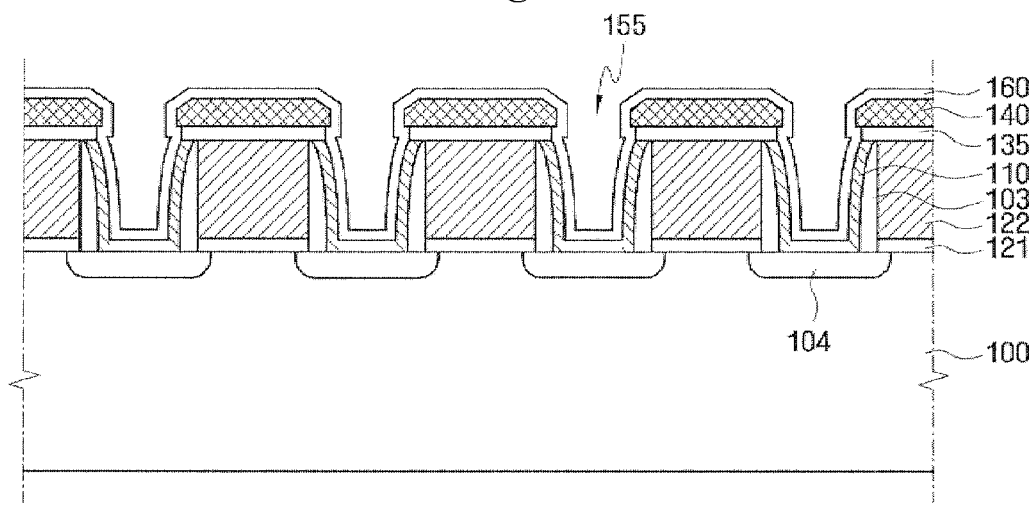

Referring to FIG. 9, in some exemplary embodiments, an auxiliary insulation layer 160 covering the second capping insulation layer patterns 140, the first capping insulation layer patterns 135 and the etch stop layer 110 is formed. In some exemplary embodiments, the auxiliary insulation layer 160 may be formed of, for example, a silicon oxide layer. The auxiliary insulation layer 160 may be formed on the entire surface of the substrate 100.

Figure 10:
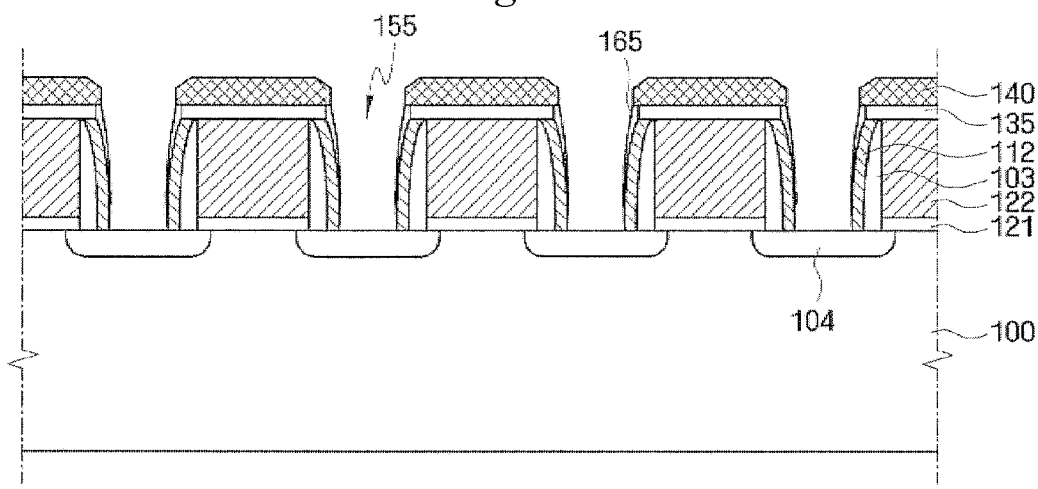

Referring to FIG. 10, in some exemplary embodiments, the auxiliary insulation layer 160 is then blanket etched. During the etching of the auxiliary insulation layer 160, a portion of the etch stop layer 110 that contacts the substrate 100 is also etched, thereby forming the etch stop patterns 112 on sidewalls of the spacers 103. In addition, a portion of the auxiliary insulation layer 160 may remain on the sidewalls of the first capping insulation layer patterns 135 to form auxiliary spacers 165. The auxiliary spacers 165 may assist in electrical insulation of the gate patterns 122. In some exemplary embodiments, in a case where the auxiliary insulation layer 160 is completely etched, the auxiliary spacers 165 may not be formed.

Figure 11:
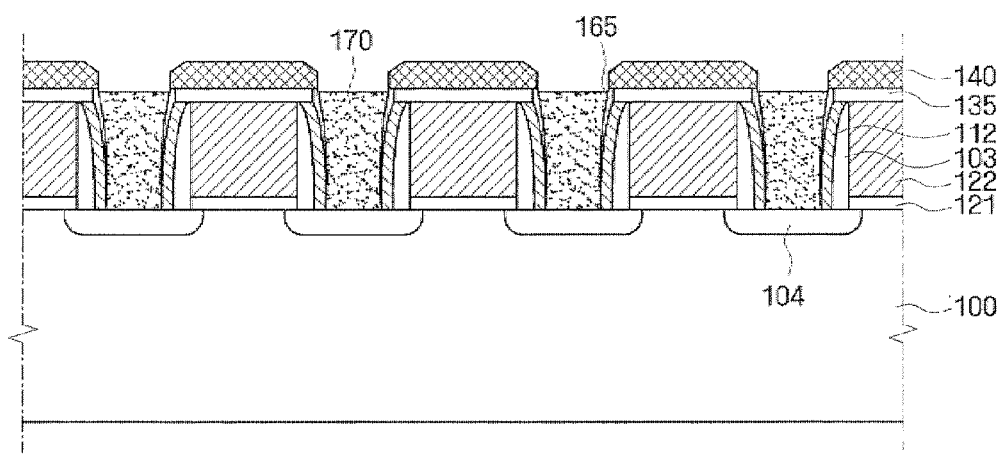

Referring to FIG. 11, in some exemplary embodiments, passivation layer patterns 170 are formed to fill the contact holes 155. The passivation layer patterns 170 may be formed by forming a passivation layer on the entire surface of the substrate 100 and then etching the passivation layer using an etch back process. In some exemplary embodiments, the passivation layer may be formed on the substrate 100 by, for example, spin coating. The etch back process of the passivation layer may be performed by dry etching or wet etching.

Figure 12:
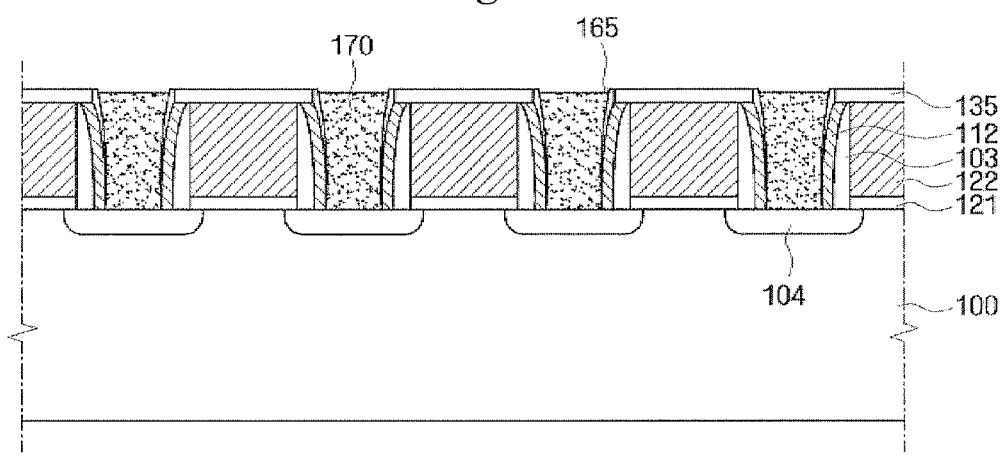

As shown in FIG. 12, the passivation layer patterns 170 may protect the spacers 103 and the etch stop patterns 112 to prevent the spacers 103 and the etch stop patterns 112 from being etched when removing the second capping insulation layer patterns 140. For example, when the second capping insulation layer patterns 140 are made of silicon nitride and the spacers 130 and the etch stop patterns 112 are also made of silicon nitride, the spacers 103 and the etch stop patterns 112 may also be etched when the second capping insulation layer patterns 140 are etched. In accordance with these exemplary embodiment of the inventive concept, however, by using the passivation layer patterns 170 to prevent the spacers 103 and the etch stop patterns 112 from being exposed, the spacers 103 and the etch stop patterns 112 are prevented from being etched when the second capping insulation layer patterns 140 are etched.

In some exemplary embodiments, top surfaces of the passivation layer patterns 170 may be lower than top surfaces of the second capping insulation layer patterns 140 and higher than top surfaces of the spacers 103 and the etch stop patterns 112. The passivation layer patterns 170 may be made of an organic material that can be easily removed. For example, in some exemplary embodiments, the passivation layer patterns 170 may be made of a spin-on hard mask (SOH) layer, an anti-reflection coating (ARC) layer, or photoresist.

Referring to FIG. 12, in some exemplary embodiments, the second capping insulation layer patterns 140 are removed. The process of removing the second capping insulation layer patterns 140 may be performed by wet etching or dry etching. In a case in which the second capping insulation layer patterns 140 are made of silicon nitride, an etching solution containing phosphoric acid may be used to remove the second capping insulation layer patterns 140. During the removal of the second capping insulation layer patterns 140, according to the exemplary embodiments of the inventive concept, since the spacers 103 and the etch stop patterns 112 are protected by the passivation layer patterns 170, they are not etched.

Figure 13:
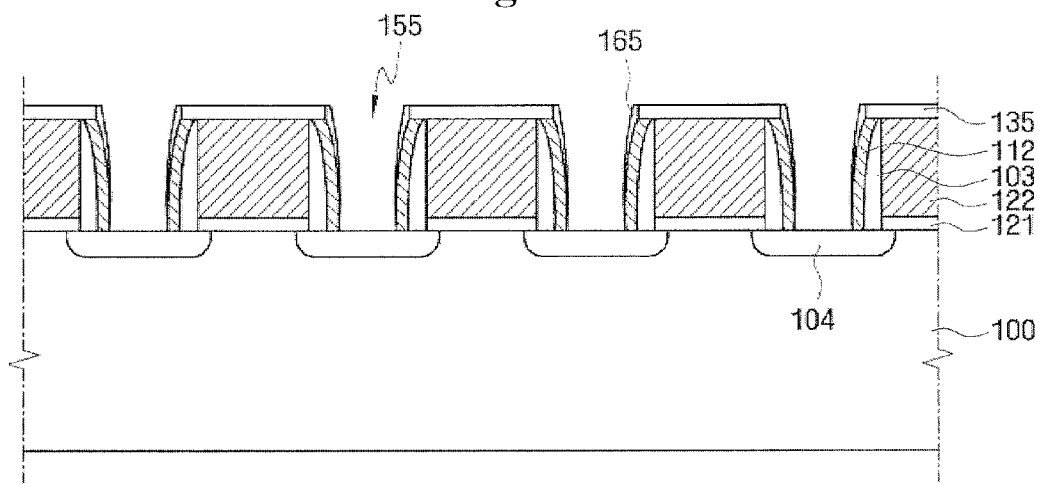

Referring to FIG. 13, in some exemplary embodiments, the passivation layer patterns 170 are removed. As the result of removing the passivation layer patterns 170, top surfaces of source/drain regions 104 formed in the substrate 100 are exposed.

Figure 14:
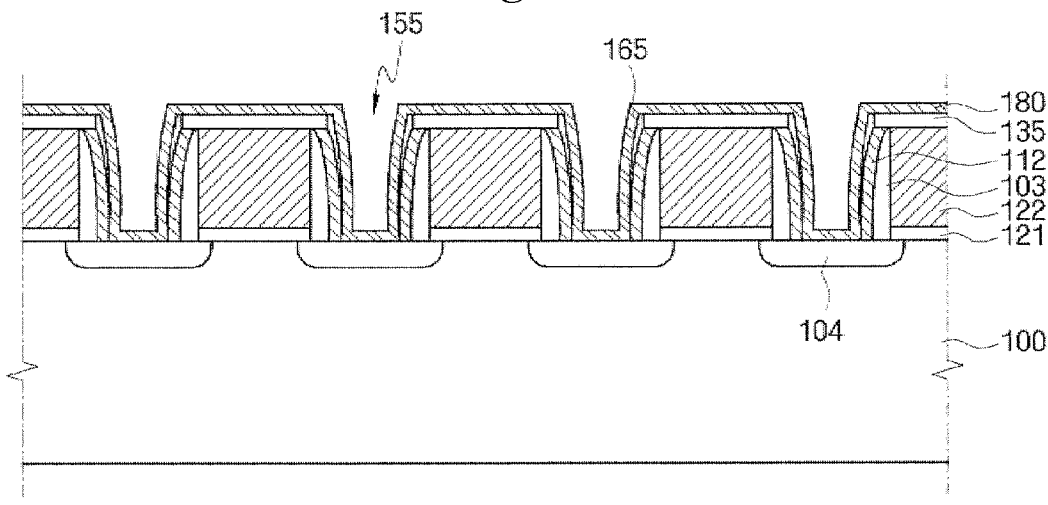

Referring to FIG. 14, in some exemplary embodiments, a silicide forming metal film 180 is formed on the entire surface of the substrate 100 having the exposed top surfaces of the source/drain regions 104. In a case in which the silicide forming metal film 180 is formed on the entire surface of the substrate 100 in a state where the first capping insulation layer patterns 135 and the second capping insulation layer patterns 140 are formed on the gate patterns 122, an aspect ratio of the contact holes 155 is so high that the silicide forming metal film 180 may not be uniformly formed on the top surfaces of the source/drain regions 104. However, according to these embodiments of the inventive concept, before forming the silicide forming metal film 180, the aspect ratio of the contact holes 155 is lowered by removing the second capping insulation layer patterns 140, thereby uniformly forming the silicide forming metal film 180 on the top surfaces of the source/drain regions 104.

In some exemplary embodiments, the silicide forming metal film 180 directly contacts the top surfaces of the first capping insulation layer patterns 135 and the top surfaces of the source/drain regions 104. In some exemplary embodiments, the silicide forming metal film 180 may be made of, for example, titanium (Ti), molybdenum (Mo), tungsten (W), cobalt (Co), nickel (Ni), tantalum (Ta), platinum (Pt), or palladium (Pd).

Figure 15:
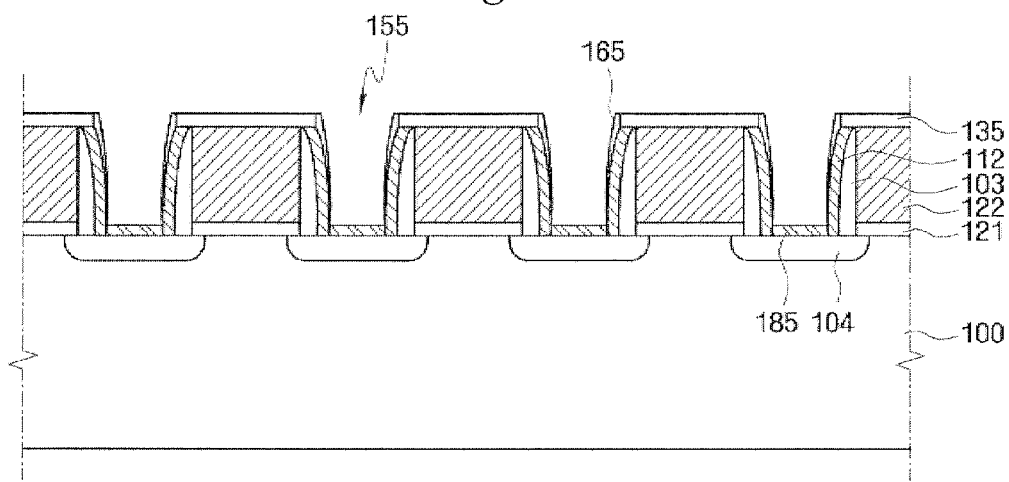

Referring to FIG. 15, in some exemplary embodiments, a silicide pattern 185 is formed on a region where the silicide forming metal film 180 contacts the top surfaces of the source/drain regions 104 by performing thermal treatment. The remaining silicide forming metal film 180 that is not subjected to silicidation is removed after the thermal treatment.

Figure 16:
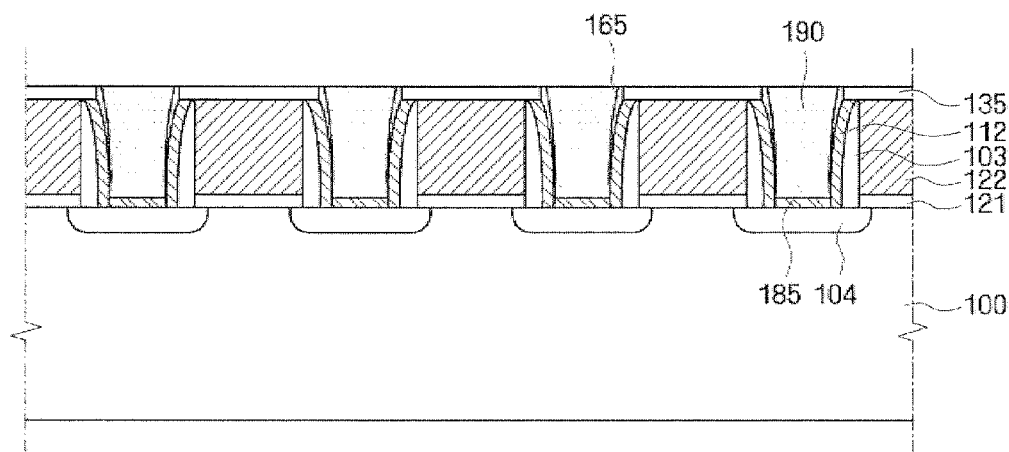

Referring to FIG. 16, in some exemplary embodiments, contact plugs 190 filling the contact holes 155 are formed. In some exemplary embodiments, the contact plugs 190 may be made of, for example, tungsten, titanium or titanium nitride. In some exemplary embodiments, the contact plugs 190 may be formed by forming a contact plug forming conductive layer on the entire surface of the substrate 100 and etching the same by, for example, CMP until the top surfaces of the first capping insulation layer patterns 135 are exposed. According to these embodiments of the inventive concept, the silicide pattern 185 and the contact plugs 190 may form self-aligned contacts.

Figure 17:
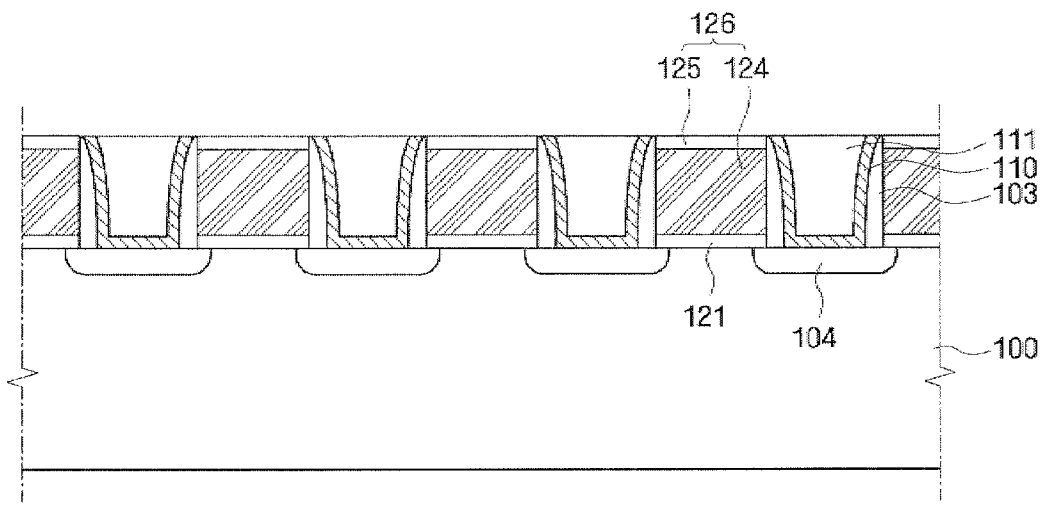
FIG. 17 is a schematic cross-sectional view illustrating a method of fabricating a semiconductor device according to an exemplary embodiment of the present inventive concept.

A method of fabricating a semiconductor device according to other embodiments of the present inventive concept will now be described in detail with reference to FIG. 17. FIG. 17 is a schematic cross-sectional view illustrating a method of fabricating a semiconductor device according to other embodiments of the present inventive concept. The same elements as those shown in FIGS. 1 to 16 are denoted by the same reference numerals, and detailed description thereof will not be repeated.

The method of fabricating a semiconductor device according to the embodiment of the present inventive concept illustrated in FIG. 17 is different from the method according to the previously described embodiments in that, in the embodiments illustrated in FIG. 17, gate patterns 126 formed within gate forming trenches (115 of FIG. 5) include conductive layer patterns 124 and oxide layer patterns 125 formed thereon. In some exemplary embodiments, the conductive layer patterns 124 may be made of, for example, aluminum, and the oxide layer patterns 125 may be formed of, for example, an aluminum oxide layer formed by oxidizing the conductive layer patterns 124.

Figure 18:
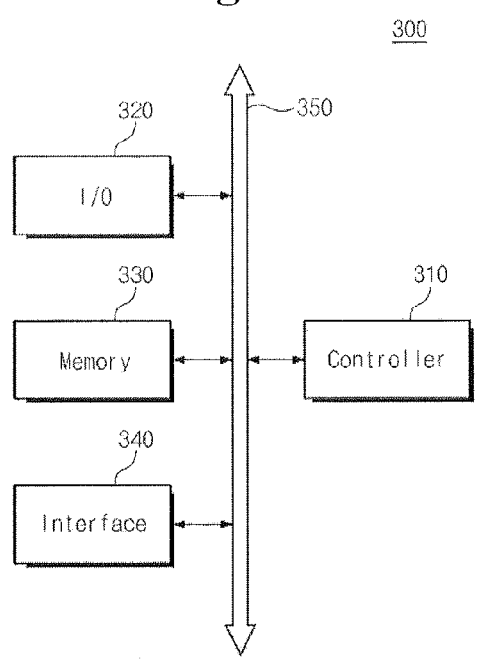
FIG. 18 is a schematic block diagram of an exemplary memory system including a semiconductor device manufactured by fabricating methods according to exemplary embodiments of the present inventive concept.

FIG. 18 is a schematic block diagram of an exemplary memory system including a semiconductor device manufactured by fabricating methods according to embodiments of the present inventive concept described herein in detail.

The semiconductor devices according to the above-described embodiments of the present inventive concept may be implemented by logic devices that perform operations on logic data. Alternatively, the semiconductor devices according to the above-described embodiments of the present inventive concept may also be implemented by memory devices that store data. In the latter case, a data storage element that stores data may be formed on a contact plug. The data storage element may be a capacitor or a variable resistor.

Referring to FIG. 18, a memory system 300 according to some exemplary embodiments of the inventive concept may be applied to a personal digital assistant (PDA), a portable computer, a web tablet, a wireless phone, a mobile phone, a digital music player, a memory card, or all other devices capable of transmitting and/or receiving information in wireless environments.

In some exemplary embodiments, the memory system 300 may include a controller 310, an input/output device (I/O) 320 such as a keypad, a keyboard, a display, or the like, a memory 330, an interface 340, and a bus 350. The memory 330 and the interface 340 communicate with each other through the bus 350.

In some exemplary embodiments, the controller 310 includes logic devices implemented according to exemplary embodiments of the present inventive concept. The logic devices may perform operations on logic data. In detail, the controller 310 may include at least one microprocessor, a digital signal processor, a microcontroller, or other similar processors.

The memory 330 may be used to store commands executed by the controller 310. The input/output device 320 may receive/transmit data or signals from/to the outside of the memory system 300. The input/output device 320 may include, for example, a keypad, a keyboard, a display, or the like. The memory 330 may include memory devices implemented according to exemplary embodiments of the present inventive concept described herein in detail. The memory 330 may further include other types of memories, arbitrarily accessible volatile memories, or other various types of memories.

The interface 340 may transmit/receive data to/from a communication network.

While the present inventive concept has been particularly shown and described with reference to exemplary embodiments thereof, it will be understood by those of ordinary skill in the art that various changes in fowl and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of fabricating a semiconductor device, the method comprising:
   forming gate patterns on a substrate;
   forming spacers on sidewalls of the gate patterns;
   forming a first capping insulation layer pattern on the gate patterns and the spacers;
   forming a second capping insulation layer pattern on the first capping insulation layer pattern;
   after forming the second capping insulation layer pattern, forming a passivation layer pattern filling contact holes between the gate patterns;
   removing the second capping insulation layer pattern completely while protecting the spacers using the passivation layer pattern;
   removing the passivation layer pattern to expose a top surface of the substrate;
   forming a silicide forming metal film on the surface of the substrate; and
   forming silicide patterns on the exposed top surface of the substrate.

2. The method of claim 1, wherein top surfaces of the passivation layer pattern are lower than top surfaces of the second capping insulation layer pattern and higher than top surfaces of the spacers.

3. The method of claim 1, wherein the passivation layer pattern comprises an organic material.

4. The method of claim 1, wherein the first capping insulation layer pattern comprises a silicon oxide layer, and the second capping insulation layer pattern and the spacers comprise a silicon nitride layer.

5. The method of claim 1, wherein the forming of the gate patterns and the spacers further comprises:
   forming dummy gate patterns on the substrate;
   forming the spacers on sidewalls of the dummy gate patterns;
   forming gate forming trenches by removing the dummy gate patterns, wherein the gate patterns are formed within the gate forming trenches.

6. The method of claim 5, further comprising, before the forming of the gate patterns, forming gate insulation layer patterns within the gate forming trenches.

7. The method of claim 1, wherein the first capping insulation layer pattern makes a direct contact with top surfaces of the gate patterns and top surfaces of the spacers.

8. The method of claim 1, further comprising forming a contact plug filling the contact hole on the silicide pattern.

9. The method of claim 1, further comprising forming an etch stop pattern on the sidewalls of the spacers.

10. The method of claim 1, before the forming of the passivation layer pattern, further comprising:
    forming an auxiliary insulation layer on the entire surface of the substrate having the second capping insulation layer pattern; and
    blanket etching the auxiliary insulation layer to expose the top surface of the substrate.

11. A method of fabricating a semiconductor device comprising:
    forming gate patterns on a substrate;
    forming spacers on sidewalls of the gate patterns;
    forming an interlayer dielectric layer filling a contact hole between the gate patterns;
    forming a first capping insulation layer on the surface of the substrate having the gate patterns and the interlayer dielectric layer;

forming a second capping insulation layer pattern on the first capping insulation layer and a mask pattern on the second capping insulation layer pattern;

forming a first capping insulation layer pattern by etching the first capping insulation layer using the mask pattern as an etch mask;

removing the interlayer dielectric layer by etching the interlayer dielectric layer using the mask pattern as an etch mask;

after removing the interlayer dielectric layer, removing the second capping insulation layer pattern to expose an entire top surface of the first capping insulation layer pattern;

forming a silicide forming metal film on the surface of the substrate; and forming silicide patterns in the contact hole by performing thermal treatment.

12. The method of claim 11, further comprising, before removing the second capping insulation layer pattern, forming a passivation layer pattern within the contact hole from which the interlayer dielectric layer is removed.

13. The method of claim 12, wherein the second capping insulation layer pattern and the spacers are formed from a silicon nitride layer.

14. The method of claim 13, wherein the passivation layer pattern is made of an organic material.

15. The method of claim 11, further comprising forming a third capping insulation layer pattern on a region of the first capping insulation layer exposed by the second capping insulation layer pattern.

16. A method of fabricating a semiconductor device, the method comprising:

forming dummy gate patterns on a substrate;

forming spacers on sidewalls of the dummy gate patterns;

removing the dummy gate patterns to form a plurality of trenches;

forming gate insulation layer patterns within the trenches;

forming a plurality of gate patterns in the plurality of trenches, respectively, such that the spacers are on sidewalls of the gate patterns;

forming a first capping insulation layer pattern on the gate patterns and the spacers;

forming second capping insulation layer pattern on the first capping insulation layer pattern;

after forming the second capping insulation layer pattern, forming a passivation layer pattern filling contact holes between the gate patterns and covering the spacers to protect the spacers;

removing the second capping insulation layer pattern completely while protecting the spacers with the passivation layer pattern such that the spacers are not removed;

removing the passivation layer pattern to expose a top surface of the substrate;

forming a silicide forming metal film on the surface of the substrate; and forming silicide patterns on the exposed top surface of the substrate.

17. The method of claim 16, wherein the semiconductor device is a semiconductor memory device.

18. The method of claim 16, wherein the semiconductor device is a semiconductor logic device.

19. The method of claim 16, further comprising forming an etch stop pattern on the sidewalls of the spacers.

20. The method of claim 16, further comprising forming a third capping insulation layer pattern on a region of the first capping insulation layer exposed by the second capping insulation layer pattern.

* * * * *